US012373009B2

(12) United States Patent
Lu

(10) Patent No.: US 12,373,009 B2
(45) Date of Patent: Jul. 29, 2025

(54) ADAPTER CARD AND GRAPHICS CARD TEST DEVICE

(71) Applicant: Fulian Precision Electronics (Tianjin) Co., LTD., Tianjin (CN)

(72) Inventor: Cheng-I Lu, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 269 days.

(21) Appl. No.: 18/126,783

(22) Filed: Mar. 27, 2023

(65) Prior Publication Data

US 2023/0305607 A1    Sep. 28, 2023

(30) Foreign Application Priority Data

Mar. 25, 2022 (CN) .......................... 202210307840.7

(51) Int. Cl.
*G06F 1/18* (2006.01)
(52) U.S. Cl.
CPC .................................. *G06F 1/185* (2013.01)

(58) Field of Classification Search
CPC .......... G06F 1/185; G06F 1/184; G06F 1/186; H05K 7/1429
See application file for complete search history.

(56) References Cited

U.S. PATENT DOCUMENTS 8,472,210 B2 * 6/2013 Chiu ....................... G06F 1/186
361/752

* cited by examiner

*Primary Examiner* — James Wu
(74) *Attorney, Agent, or Firm* — ScienBiziP, P.C.

(57) ABSTRACT

An adapter card for mounting expansion card to motherboard includes a card-board, a slot, and a plug. The card-board includes a connecting piece located in the slot for connecting the expansion card to the card-board. The post and the latch are configured for fixing the expansion card, the plug is configured for connecting the card-board to a motherboard. The expansion card is designed with special specifications which cannot be inserted into the regular slot on motherboard, but the adapter card can adapt the expansion card designed to the regular slot on the motherboard, without changing types of the slot on the motherboard, improving efficiency of mounting expansion card. A graphics card test device using the adapter card is also disclosed.

16 Claims, 5 Drawing Sheets

ADAPTER CARD AND GRAPHICS CARD TEST DEVICE

FIELD

The subject matter herein generally relates to adaption of expansion cards to motherboards, and to an adapter card for expansion cards with a graphics card test device.

BACKGROUND

Expansion cards in standard design can be directly inserted into a regular slots, such as a standard PCIe4 slot. However, some expansion cards with golden finger designs have special specifications which cannot be inserted into a regular slot, resulting in low efficiency of mounting.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
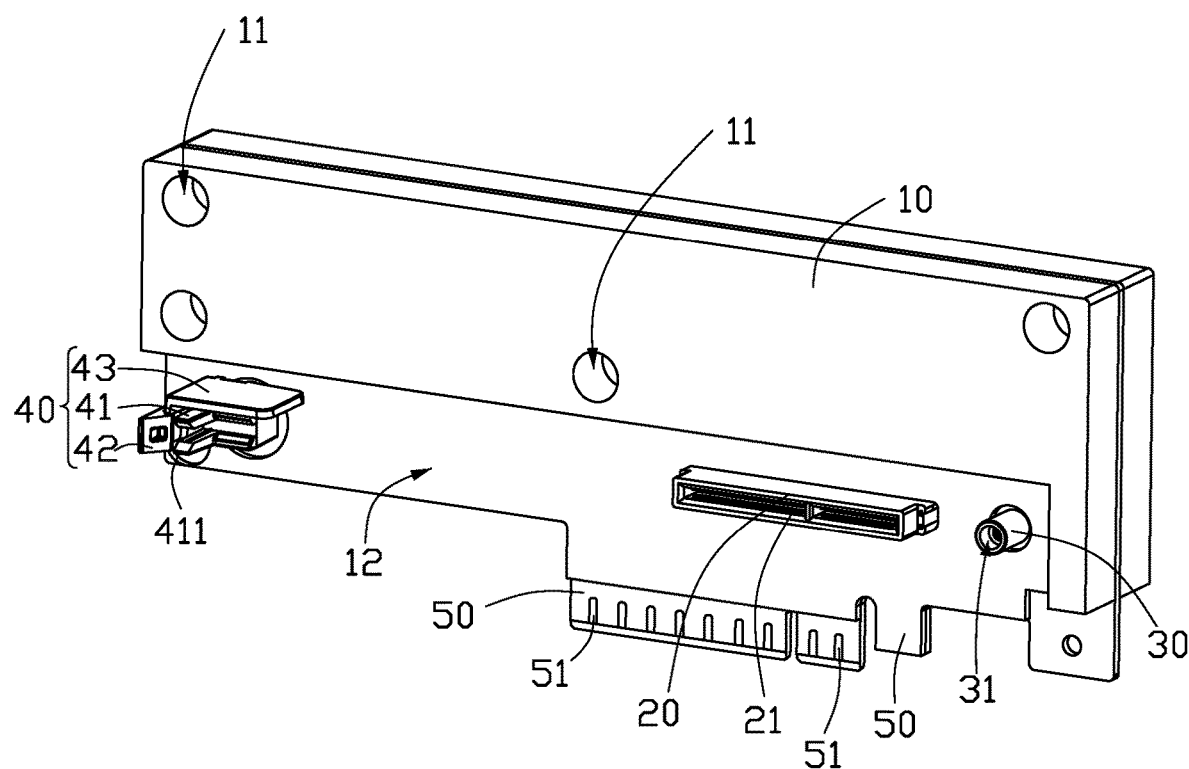
FIG. 1 is an isometric view of an adapter card according to an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The present disclosure, including the accompanying drawings, is illustrated by way of examples and not by way of limitation. Several definitions that apply throughout this disclosure will now be presented. It should be noted that references to "an" or "one" embodiment in this disclosure are not necessarily to the same embodiment, and such references mean "at least one".

The term "comprising" means "including, but not necessarily limited to"; it specifically indicates open-ended inclusion or membership in a so-described combination, group, series, and the like.

Without a given definition otherwise, all terms used have the same meaning as commonly understood by those skilled in the art. The terms used herein in the description of the present disclosure are for the purpose of describing specific embodiments only, and are not intended to limit the present disclosure.

As shown in FIG. 1 to FIG. 5, an adapter card 100 for mounting expansion cards to motherboards in one embodiment includes a card-board 10, a slot 20, a post 30, a latch 40, and a plug 50. The slot 20, the post 30, and the latch 40 are located on the same surface of the card-board 10. The plug 50 extends out of the card-board 10 along the surface of the card-board 10. The slot 20 is used for connecting the expansion card 200 to the card-board 10. The post 30 and the latch 40 are used for positioning the expansion card 200 to the card-board 10. The plug 50 is used for connecting the card-board 10 to a motherboard 60. The slot on motherboard 60 is a regular slot designed in standard. The expansion card 200 is designed by gold finger with special specifications, which cannot be inserted directly into the regular on motherboard 60. The slot 20 is designed specifically for the expansion card 200, and the expansion card 200 can insert into the slot 20. The plug 50 is designed in standard, which is insertable into the slot on motherboard 60. The adapter card 100 transfers the expansion card 200 to the motherboard 60, so that the motherboard 60 adapts the expansion card 200, without changing the slot on motherboard 60, resulting in higher positioning accuracy of mounting expansion card 200.

As shown in FIG. 1 to FIG. 4, the card-board 10 is a rectangle board. The slot 20, the post 30, and the latch 40 are located on the same surface of the card-board 10. The plug 50 extends out of the card-board 10, and the plug 50 is located on the bottom of the card-board 10.

In some embodiments, the card-board 10 includes a plurality of positioning holes 11, the positioning holes 11 are used for positioning the adapter card 100. Some positioning holes 11 are located on the corners of the card-board 10, and some positioning holes 11 are located on the center of the card-board 10.

In some embodiments, the card-board 10 includes a groove 12, and the slot 20, the latch 40, and the post 30 are located in the groove 12, reducing the volume of the adapter plate 10.

In some embodiments, the plug 50 is a hard circuit board, the plug 50 is used for electrically connecting to the motherboard 60.

In some embodiments, the card-board 10 includes a connecting piece 21, and the connecting piece 21 is located in the slot 20 for connecting the expansion card 200 to the card-board 10. In some embodiments, a plurality of connecting pieces 21 are arranged in line in the slot 20, and each connecting piece 21 is a hard circuit board. When the expansion card 200 is inserted into the slot 20, the golden finger of the expansion card 200 contact with the connecting piece 21 for transmitting signal.

As shown in FIG. 1 to FIG. 4, the post 30 is located on one side of the slot 20. The post 30 has a fixing hole 31. When the expansion card 200 is inserted into the slot 20, a screw is inserted into the fixing hole 31 to position the expansion card 200.

In some other embodiments, the expansion card 200 can be positioned in other ways, for example, the post 30 can be replaced by buckle, lock, etc.

Figure 2:
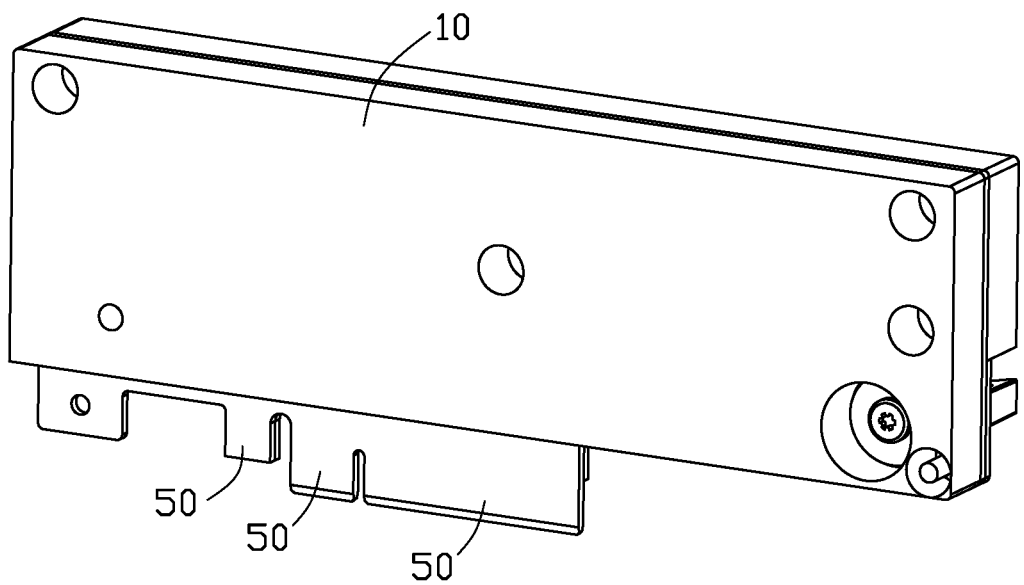
FIG. 2 is another isometric view of the adapter card of FIG. 1.
Figure 3:
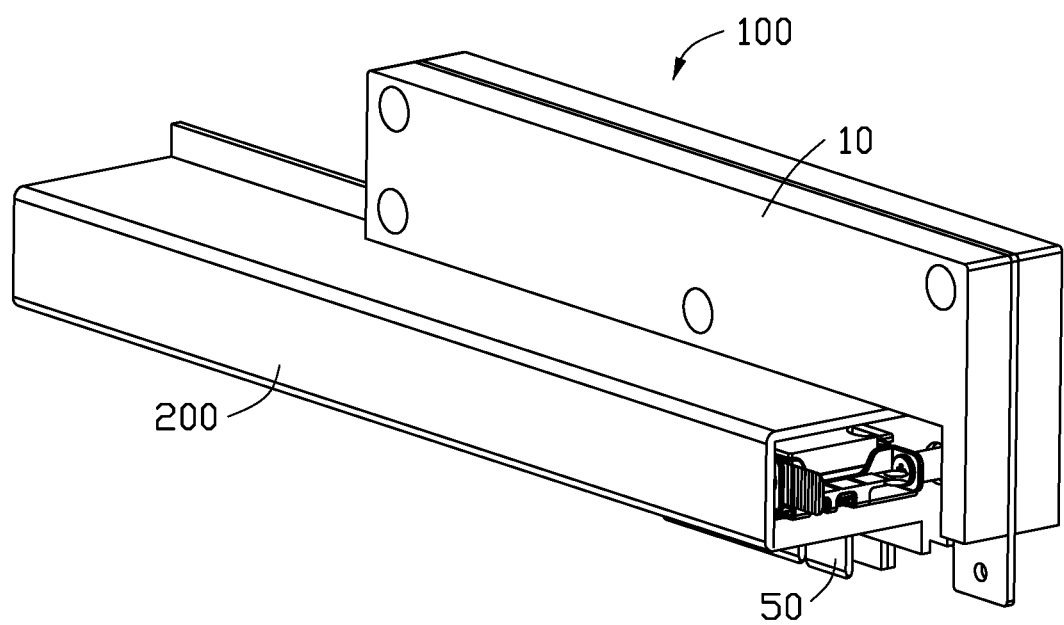
FIG. 3 is an isometric view of an adapter card and an expansion card according to an embodiment of the present disclosure.
Figure 4:
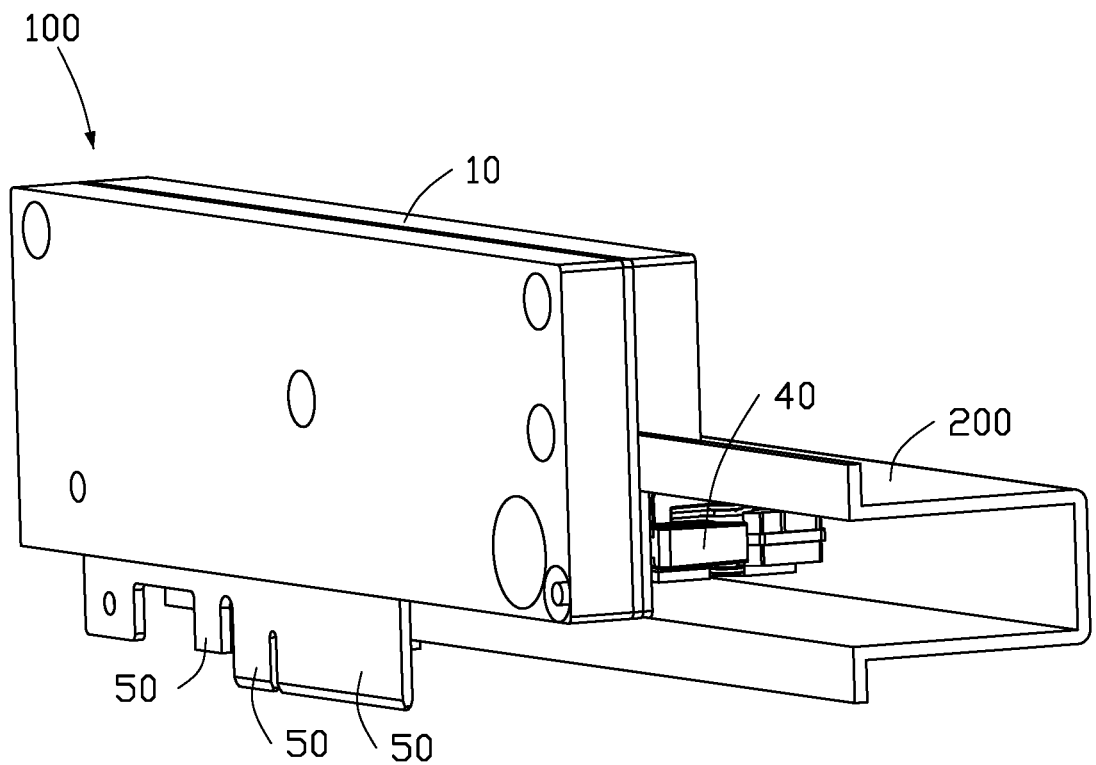
FIG. 4 is another isometric view of the adapter card and the expansion card of FIG. 6.

In some other embodiments, the slot 20 is located between the latch 40 and the post 30. The latch 40 includes two holders 41, the two holders 41 are arranged symmetrically and opposite to each other, the two holders 41 are used for clipping the expansion card 200. Each of the two holders 41 has a guiding bevel 411. The two guiding bevels 411 face to each other, and the distance between the two guiding bevels 411 gradually increases in the direction into the slot 20. The guiding bevel 411 is used for guiding the expansion card 200 to slide into the slot 20. As shown in FIG. 1 and FIG. 2, the distance between the two holders 41 is almost the same with the thickness of the expansion card 200. When the expansion card 200 is inserted into the slot 20, the both side of the expansion card 200 slide along the guiding bevels 411 until the expansion card 200 is inserted into the slot 20.

In some other embodiments, the latch 40 further includes a first limiting part 42. The first limiting part 41 is located on the same side of the two holders 41. The first limiting part 41 is used for positioning the expansion card 200 in a first direction. The first direction is the direction of the length of the card-board 10. As shown in FIG. 1, the first limiting part 42 is located on the left of the two holders 41, for the convenience of the installation of the expansion card 200.

In some other embodiments, the latch 40 further includes a second limiting part 43. The second limiting part 43 is located on the side of one of the two holders 41 opposite to another one of the two holders 41. The second limiting part 43 is used for positioning the expansion card 200 in a second direction. The second direction is substantially perpendicular to the first direction. The second direction is the direction along the height of the card-board 10. As shown in FIG. 1, the second limiting part 43 is located on the top of the two holders 41, for the convenience of the installation of the expansion card 200.

As shown in FIG. 1 and FIG. 2, the plug 50 includes conductive piece 51. When the plug 50 is inserted into the slot of the motherboard 60, the conductive piece 51 electrically connects to the motherboard 60 to transmitting signal.

In some other embodiments, the plug 50 is a hard circuit board. The card-board 10 includes a plurality of plugs 50, and the plugs 50 are arranged at intervals. Some of the plugs 50 have conductive piece 51 to transmit signal, and some of the plugs 50 have no conductive piece 51 to fix the connection between the adapter card 100 and the motherboard 60. The plugs 50 is adapted to the regular slot on the motherboard 60.

In some other embodiments, the expansion card 200 is a designed with special specifications, which cannot adapt to any regular slot, such as regular PCI-Ex4 slot, PCI-Ex8 slot, and PCI-Ex16 slot for memory card or SSD. The plug 50 adapts to PCI-Ex4 slot, PCI-Ex8 slot, or PCI-Ex16 slot.

Figure 5:
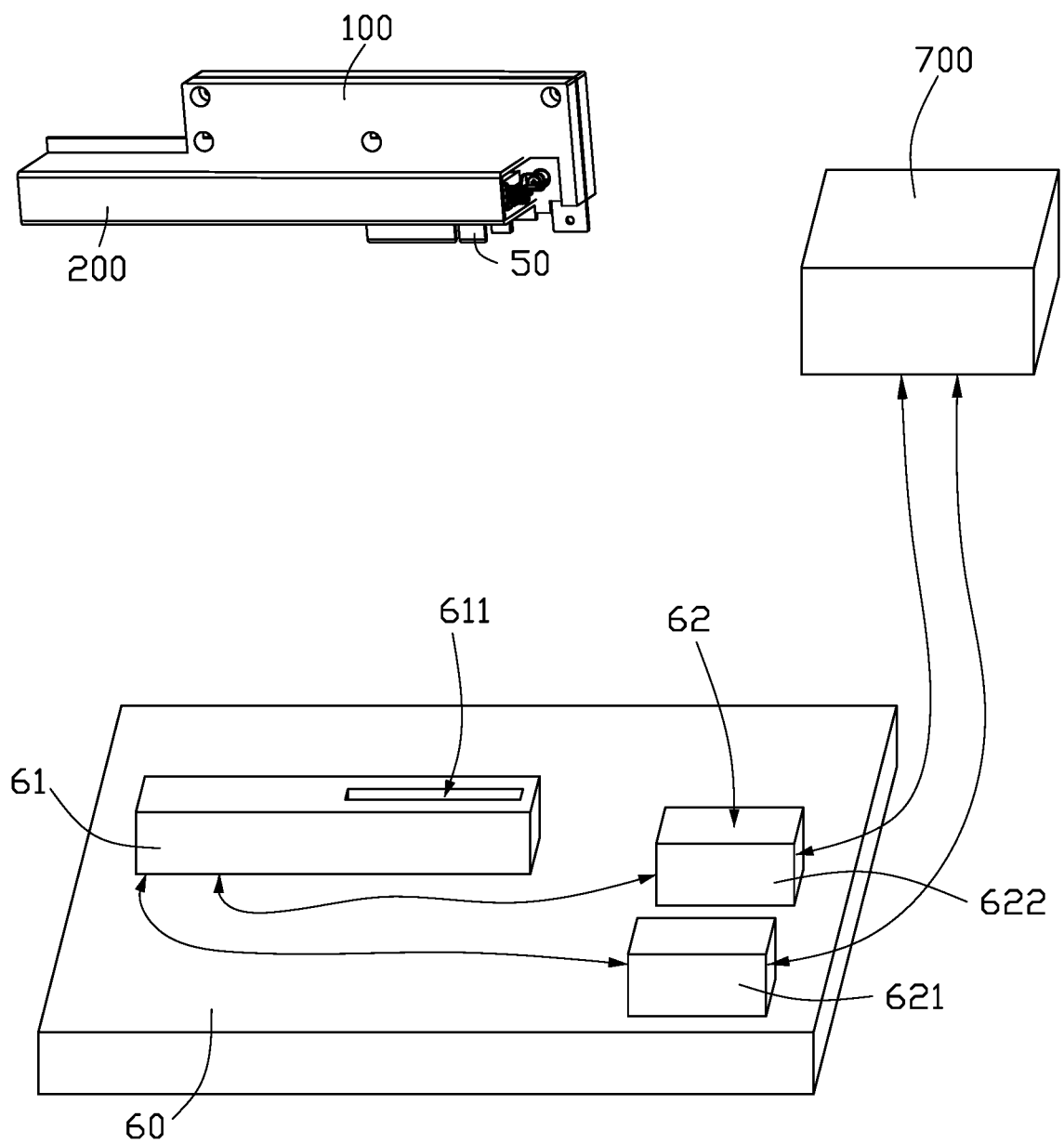
FIG. 5 is an isometric view of a graphics card test device according to an embodiment of the present disclosure.

As shown in FIG. 5, a graphics card test device 600 of an embodiment includes the motherboard 60 and the adapter card 100. The motherboard 60 includes a first connector 61 and a second connector 62. The first connector 61 and the second connector 62 are electrically connected to the motherboard 60. The expansion card 200 is electrically inserted into the adapter card 100. The adapter card 100 is electrically inserted into the first connector 61. The second connector 62 is connected to a graphics card 700. The expansion card 200 is used for testing the graphics card 700.

In some embodiments, the first connector 61 is PCI-E connector, which has a slot 611. The adapter card 100 is insertable into the slot 611. Furthermore, the first connector 61 is PCI-Ex1, PCI-Ex4, PCI-Ex8, or PCI-Ex16.

In some embodiments, the second connector 62 includes a single bus connector, such as one wire connector 621, or a serial bus connector, such as I2C connector 622. The second connector 62 is used for testing the graphics card 700 in different way by being one wire connector 621 or I2C connector 622.

In some embodiments, the second connector 62 includes one wire connector 621 and I2C connector 622, to test the graphics card 700 in two ways in the same time.

In summary, the adapter card 100 can adapt an expansion card 200 designed with special specifications to a regular slot on the motherboard, without changing types of the slot on the motherboard, improving efficiency of mounting expansion card 200.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims.

What is claimed is:

1. An adapter card configured for mounting expansion card, the adapter card comprising:
   a card-board;
   a slot located on the card-board;
   a post located on the card-board;
   a latch located on the card-board; and
   at least one plug extended out of the card-board; wherein
   the slot, the post, and the latch are located on a same surface of the card-board, the card-board comprises a connecting piece located in the slot, the connecting piece is configured for connecting the expansion card to the card-board, the post and the latch are configured for fixing the expansion card, the plug is configured for connecting the card-board to a motherboard;
   the card-board is a hard circuit board, the connecting piece in the slot is electrically connected to the card-board;
   the latch comprises two holders, the two holders are arranged opposite to each other, the two holders are configured for clipping the expansion card;
   the latch further comprises a first limiting part, the first limiting part is located on a same side of the two holders, the first limiting part is configured for positioning the expansion card in a first direction;
   the latch further comprises a second limiting part, the second limiting part is located on a side of one of the two holders which is opposite to another one of the two holders, the second limiting part is configured for positioning the expansion card in a second direction, the second direction is substantially perpendicular to the first direction.

2. The adapter card of claim 1, wherein:
   the plug is a hard circuit board, the plug is configured for electrically connecting to the motherboard.

3. The adapter card of claim 2, wherein:
   the card-board comprises a plurality of plugs, the plurality of plugs are arranged at intervals.

4. The adapter card of claim 1, wherein:
   the card-board is provided with a groove, the slot, the latch, and the post are located in the groove.

5. The adapter card of claim 1, wherein:
   the post and the latch are located on opposite sides of the slot.

6. The adapter card of claim 1, wherein:
the card-board is provided with a positioning hole, the positioning hole is configured for positioning the adapter card.

7. A graphics card test device comprising:
a motherboard comprising a first connector and a second connector; and
an adapter card configured for connecting an expansion card to the motherboard;
wherein the adapter card comprises:
a card-board;
a slot located on the card-board;
a post located on the card-board;
a latch located on the card-board; and
at least one plug extended out of the card-board;
the slot, the post, and the latch are located on a same surface of the card-board, the card-board comprises a connecting piece located in the slot, the connecting piece is configured for connecting the expansion card to the card-board, the post and the latch are configured for fixing the expansion card, the plug is configured for connecting the card-board to the motherboard;
wherein the first connector and the second connector are electrically connected to the motherboard, the expansion card is electrically inserted into the adapter card, the adapter card is electrically inserted into the first connector, the second connector is connected to a graphics card, the expansion card is configured for testing the graphics card.

8. The graphics card test device of claim 7, wherein:
the card-board is a hard circuit board, the connecting piece in the slot is electrically connected to the card-board.

9. The graphics card test device of claim 8, wherein:
the latch comprises two holders, the two holders are arranged opposite to each other, the two holders are configured for clipping the expansion card.

10. The graphics card test device of claim 9, wherein:
the latch further comprises a first limiting part, the first limiting part is located on a same side of the two holders, the first limiting part is configured for positioning the expansion card in a first direction.

11. The graphics card test device of claim 10, wherein:
the latch further comprises a second limiting part, the second limiting part is located on a side of one of the two holders which is opposite to another holder, the second limiting part is configured for positioning the expansion card in a second direction, the second direction is substantially perpendicular to the first direction.

12. The graphics card test device of claim 7, wherein:
the plug is a hard circuit board, the plug is configured for electrically connecting to the motherboard.

13. The graphics card test device of claim 12, wherein:
the card-board comprises a plurality of plugs, the plurality of plugs are arranged at intervals.

14. The graphics card test device of claim 7, wherein:
the card-board is provided with a groove, the slot, the latch, and the post are located in the groove.

15. The graphics card test device of claim 7, wherein:
the post and the latch are located on opposite sides of the slot.

16. A graphics card test device comprising:
a motherboard comprising a first connector and a second connector; and
an adapter card configured for connecting an expansion card to the motherboard;
wherein the adapter card comprises:
a card-board;
a slot located on the card-board;
a post located on the card-board;
a latch located on the card-board; and
at least one plug extended out of the card-board;
the slot, the post, and the latch are located on a same surface of the card-board, the card-board comprises a connecting piece located in the slot, the connecting piece is configured for connecting the expansion card to the card-board, the post and the latch are configured for fixing the expansion card, the plug is configured for connecting the card-board to the motherboard;
wherein the first connector and the second connector are electrically connected to the motherboard, the expansion card is electrically inserted into the adapter card, the adapter card is electrically inserted into the first connector, the second connector is connected to a graphics card, the expansion card is configured for testing the graphics card, the second connector is a serial bus connector or a single bus connector.

* * * * *